United States Patent [19]
Chiang et al.

[11] Patent Number: 6,042,976
[45] Date of Patent: Mar. 28, 2000

[54] METHOD OF CALIBRATING WEE EXPOSURE TOOL

[75] Inventors: Wen-Chong Chiang, Taichung County; Jung-Hau Hsiue, Hsin-Chu; Shih-Chang Shih, Hsin-Chu; Yung-Dar Chen, Hsin-Chu, all of Taiwan

[73] Assignee: Taiwan Semiconductor Manufacturing Company, Ltd., Hsin-Chu, Taiwan

[21] Appl. No.: 09/245,561

[22] Filed: Feb. 5, 1999

[51] Int. Cl.⁷ ........................................................ G03F 9/00
[52] U.S. Cl. ................................................ 430/22; 430/30
[58] Field of Search .......................................... 430/22, 30

[56] References Cited

U.S. PATENT DOCUMENTS

| | | | |
|---|---|---|---|
| 5,545,570 | 8/1996 | Chung et al. | 437/8 |
| 5,699,282 | 12/1997 | Allen et al. | 364/571.01 |
| 5,723,385 | 3/1998 | Shen et al. | 438/763 |
| 5,824,457 | 10/1998 | Liu et al. | 430/394 |

*Primary Examiner*—Christopher G. Young
*Attorney, Agent, or Firm*—George O. Saile; Stephen B. Ackerman

[57] ABSTRACT

The invention provides four sub-patterns located at the periphery of the wafer surface at 90-degree intervals. Each of the four sub-patterns is divided into four alignment scales where each alignment scale is yet again subdivided into a multiplicity of alignment marks. This multiplicity of sub-patterns and alignment scales with each scale having a multiplicity of alignment marks results in very accurate and convenient alignment capability.

12 Claims, 4 Drawing Sheets

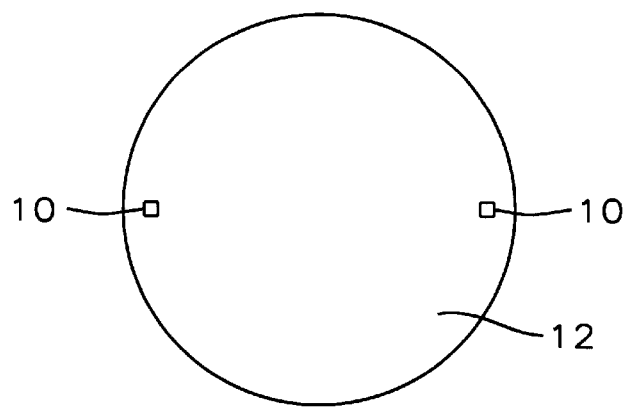
FIG. 1 – Prior Art
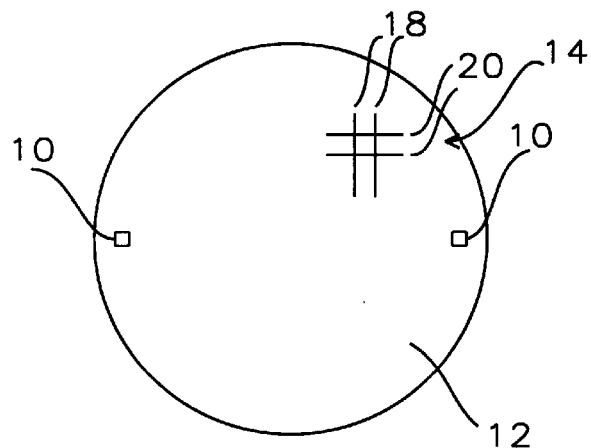
FIG. 2a – Prior Art
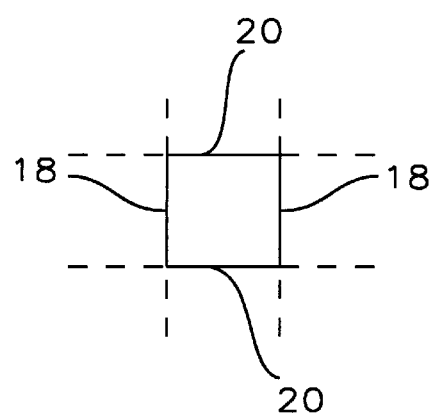
FIG. 2b – Prior Art
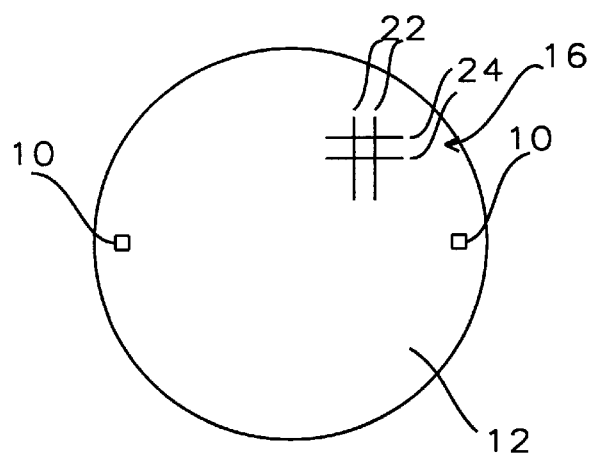
FIG. 3a – Prior Art
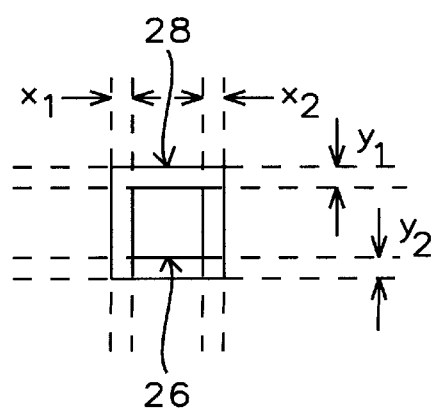
FIG. 3b – Prior Art

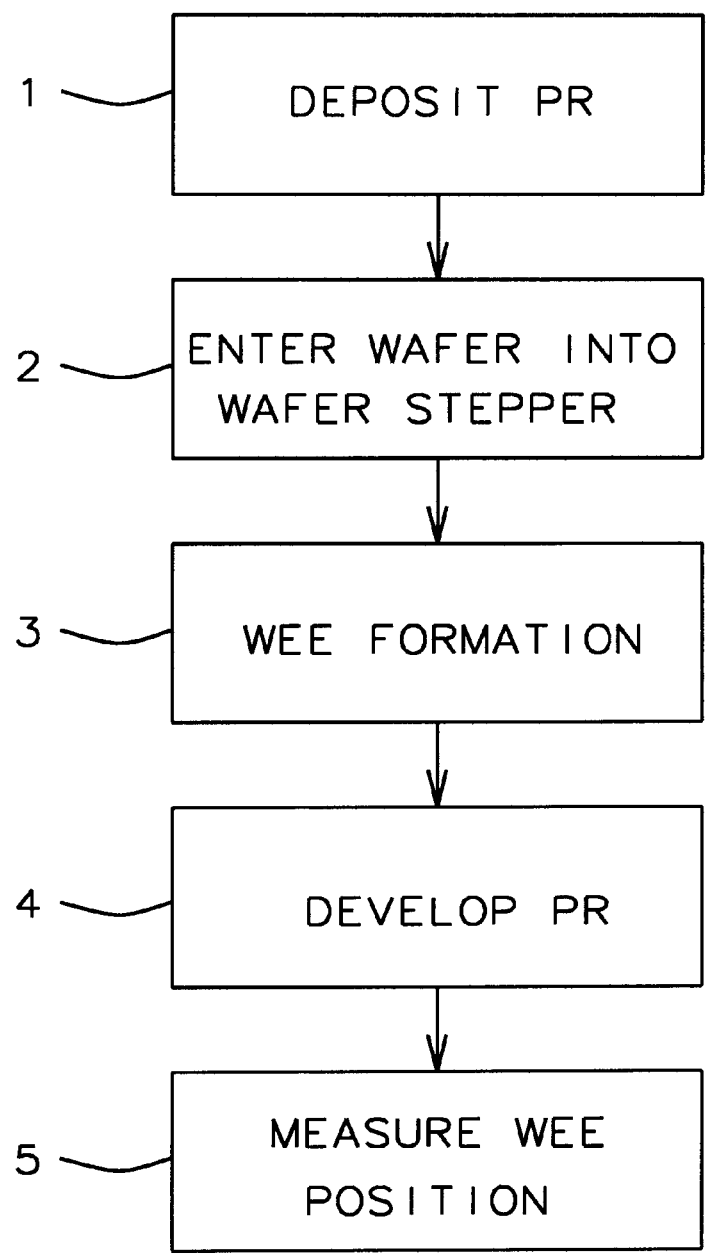
FIG. 4 - Prior Art

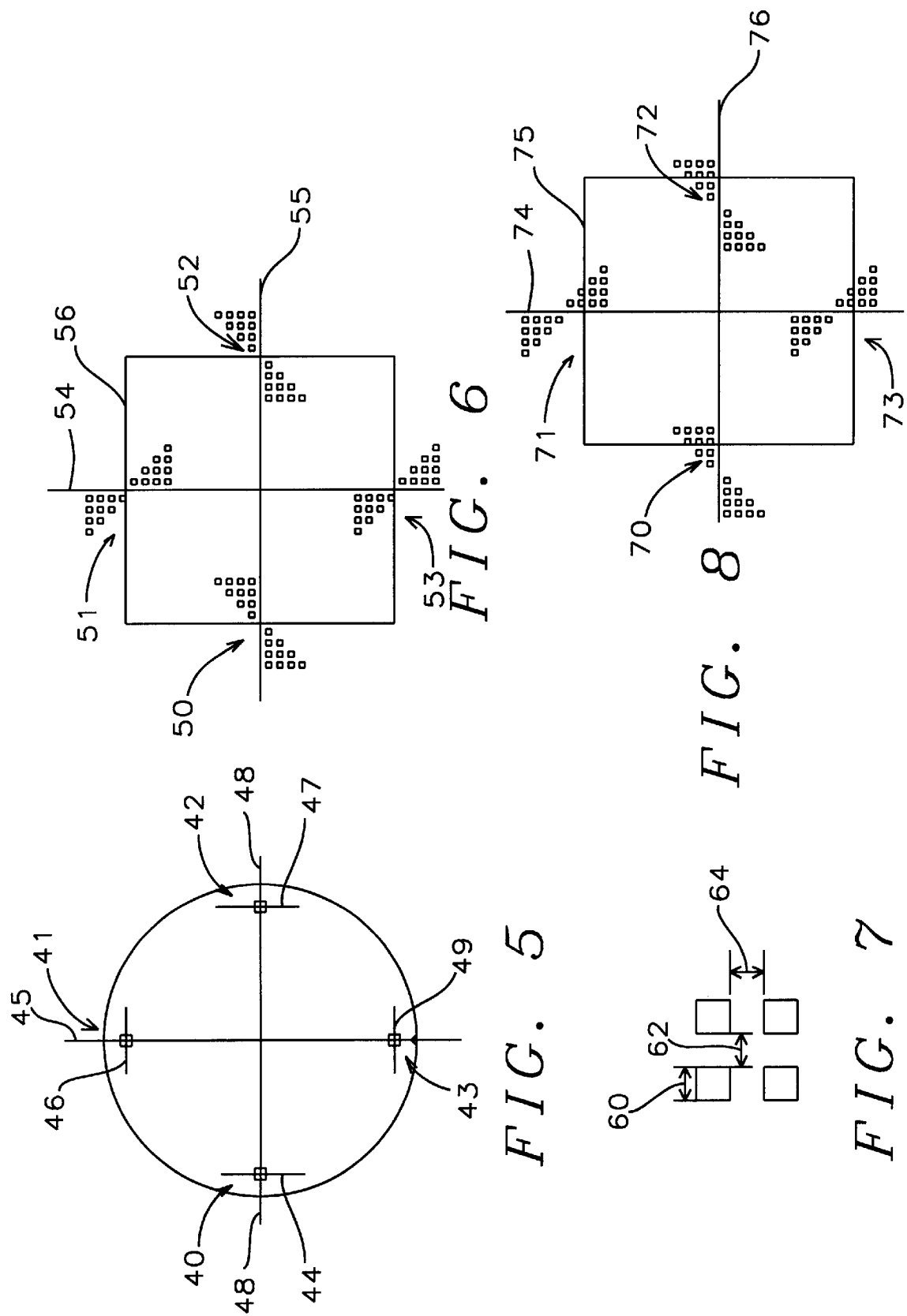

METHOD OF CALIBRATING WEE EXPOSURE TOOL

BACKGROUND OF THE INVENTION (1) Field of the Invention

The invention relates to semiconductor manufacturing processing, and more specifically to a method of positioning a wafer by using a new Wafer Edge Exposure (WEE) technique.

(2) Description of the Prior Art

Standard practice in positioning and aligning a wafer during wafer processing operations is to use an inspection pattern on the semiconductor wafer to determine the degree of alignment of a first device layer.

A great number of the processing steps used during the manufacturing of semiconductor devices are based on the application of photolithographic exposures. Of key importance in making successive photolithographic exposures is that successive layers of patterns are accurately aligned with respect to each other. The degree of misalignment that can occur between successive photolithographic exposures is known as pattern overlay, overlay than represents the degree of misalignment that occurs between successive layers of patterns on thin film electronic structures and the preceding layer.

The term overlay represents the relative location of features formed during different steps of the semiconductor wafer processing sequence. The overlay is a numeric quantity that is defined at every location on the substrate as the difference between a numerical value indicative of a position or location on the first formed portion of a semiconductor structure on a substrate and a numeric quantity of the corresponding point on a following or second formed portion of a semiconductor structure. Perfect alignment between the first and the second portion of the semiconductor structure requires that the overlay, as defined here, be equal to zero.

One approach in aligning wafer is to use an independent process layer, the so-called zeroth layer, as the source of reference and to align all process layers to this zeroth layer. Techniques and measuring tools are provided to measure the degree of shift that occurs in the overlay of the successive layers and patterns. All these techniques use alignment patterns of a particular design that are applied to both successive and preceding layers. The first layer used in this alignment sequence does, by its very nature, not have a reference point or pattern. This may lead to considerable problems of alignment in subsequent alignment steps.

FIG. 1 shows the Prior Art method of placing reference marks 10 on the surface of wafer 12, this top view of the wafer surface represents the previously highlighted zeroth layer process. This process places the reference marks on the surface of the substrate. Successive formations of patterns use marks 10 as alignment marks, it is a given that the overlay of the marks 10 for the successive patterns that are formed on the semiconductor substrate is zero. That is the marks 10 are, going from the preceding to the following deposition of patterns, in perfect alignment. Measured is the overlay within the successive patterns while these patterns are being created.

FIG. 2 shows the creation of a preceding pattern 14 formed on the wafer 12 by use of prior art method of chip manufacturing using two intersecting patterns 18 and 20. FIG. 2b shows a magnification of the pattern 14 as representative of the first pattern that is created on the surface of the semiconductor substrate. This pattern is created at scribe lines within the surface of the semiconductor substrate and serves as the reference pattern for the measurement of the alignment of the following patterns.

FIG. 3a shows the formation of a following or second pattern 16 on the surface of the semiconductor substrate as representative of the second pattern that is created on the surface of the semiconductor substrate. The pattern 16 is created by use of prior art method of chip manufacturing using two intersecting patterns 22 and 24. The pattern 16 (FIG. 3a) is roughly in the same geometric location on the wafer surface as the previously highlighted first pattern (pattern 14, FIG. 2a). FIG. 3b shows a magnified image where the reference pattern (pattern 14, FIG. 2a) is superimposed over the pattern that is representative of the second pattern (pattern 16, FIG. 3a). The smaller square 26 is patterned in the second pattern in the same geometric location as the reference square 28.

It is clear from FIG. 3b that in measuring values for $x_1$, $x_2$, $y_1$ and $y_2$ accurate conclusions can be drawn relating to the relative position of the second pattern (pattern 16, FIG. 3a) with respect to the first or reference pattern (patter 14, FIG. 2a). It is also clear that the alignment accuracy of following layers can be determined in the same manner.

One of the main concerns during wafer manufacturing is the control and elimination of contaminants or impurities that exist in the environment wherein the wafer is being processed. The environment can introduce these impurities or they can be created by particles that are created as part of the wafer manufacturing process itself.

Environmentally introduced impurities are typically controlled by the use of filters and extremely stringent controls of clean environment imposed within the semiconductor manufacturing area.

Contaminants introduced by the wafer that is being processed can, due to the complexity of the various processing steps combined with the variety of materials that are used during wafer processing, be of a variety of sources and a variety of materials. The method used to mechanically handle the wafer, such as wafer clamp down and wafer movement between the wafer processing stations can lead to severe stress within points of contact of the wafer. This stress can be the source of creation of contaminants.

It is clear that, in controlling wafer contaminants, the edge of the wafer is a critical area. This is the area where mechanical contact with the wafer takes place and this is therefore the area where contaminants are most likely to be created or where the further dissemination of contaminants is best controlled. One method that has been successfully used for this purpose is the chamfering or rounding off of the edges of the wafer prior to the formation of any of the active layers on the wafer. Another method that has seen application is the removing or grinding of the periphery of the wafer. Both of these methods however create, by their very nature, yet more particles that can therefore be contributing to further contamination of the wafer that is being processed.

Another method to suppress wafer contaminants is the use of building an edge around the perimeter of the wafer whereby this edge suppresses the flow of contaminants. Wafer Edge Exposure (WEE) is a process whereby the edge of a wafer is fabricated such that polishing contaminants and slurry residues are prevented from entering the scribe channels of the wafer. This is accomplished by depositing a layer of photosensitive polyimide on the surface of the wafer and mounting the wafer on a chuck. The chuck is then spun thereby exposing the outer perimeter of the wafer to a light source. Due to the negative resists characteristic of the polyimide, the exposed ring of polyimide will remain in place when the wafer is developed while the unexposed portion of the polyimide will be removed. This unexposed portion of the polyimide corresponds to the scribe line pattern on the surface of the wafer; this scribe line pattern is therefore dissolved while the ring of exposed polyimide around the periphery of the wafer remains in place. This WEE forms an edge that, together with a grinding tape, forms a seal along the perimeter of the wafer. This seal prevents contaminants and slurry remains from entering into the scribe channels.

FIG. 4 shows the Prior Art processing steps for WEE fabrication. Step 1 indicates that a layer of Photo Resist/Polyimide is deposited on the surface of the layer, the wafer is entered into a wafer stepper tool (step 2) after which the layer of PR is exposed and (step 3) the WEE is formed by holding a sharply focused source of UV light over the edge of the wafer while rotating the wafer. The entire edge of the wafer is in this manner exposed to the UV light. The layer of PR is developed (step 4) after which the created WEE is measured (step 5) to determine if any of the product dice were mistakenly exposed to the UV light. This measurement procedure uses vernier calipers to manually calibrate the WEE exposure region. The invention teaches a method whereby this manual calibration is replaced and the WEE offset value can be read directly.

U.S. Pat. No. 5,824,457 (Liu et al.) teaches a WEE process.

U.S. Pat. No. 5,723,385 (Shen) discusses WEE methods where each layer is recessed from the wafer edge.

U.S. Pat. No. 5,699,282 (Allen et al.) teaches overlay patterns.

U.S. Pat. No. 5,545,570 (Chung et al.) discloses a pattern to measure overlay shift in the first layer.

SUMMARY OF THE INVENTION

It is the primary objective of the invention to provide a calibration pattern for accurate and easy measurement of wafer alignment.

In accordance with the objective of the invention, the invention provides four patterns located at the periphery of the wafer surface at 90-degree intervals. Each of the four patterns is divided into four sub-patterns or measurement scales where each measurement scale is yet again subdivided into a multiplicity of alignment marks. This multiplicity of measurement scales with each measurement scale having a multiplicity of alignment marks results in a very accurate and convenient method to measure wafer alignment accuracy.

BRIEF DESCRIPTION OF THE DRAWINGS

FIG. 1 shows a Prior Art top view of a wafer surface with reference marks.

FIG. 2a shows a Prior Art top view of a wafer surface with reference marks whereto is added a first alignment pattern.

FIG. 2b shows an amplified view of a Prior Art alignment image.

FIG. 3a shows a Prior Art top view of a wafer surface with reference marks whereto is added a second alignment pattern.

FIG. 3b shows an amplified view of a Prior Art first alignment image superimposed over which is a second alignment image.

FIG. 4 shows a Prior Art process flow used for forming the WEE area.

FIG. 5 shows top view of a wafer surface onto which four alignment patterns have been deposited.

FIG. 6 shows a detailed top view of one of the four alignment patterns.

FIG. 7 shows a set of four alignment marks.

FIG. 8 shows and example of the application of an alignment pattern.

DESCRIPTION OF THE PREFERRED EMBODIMENT

Figure 9:
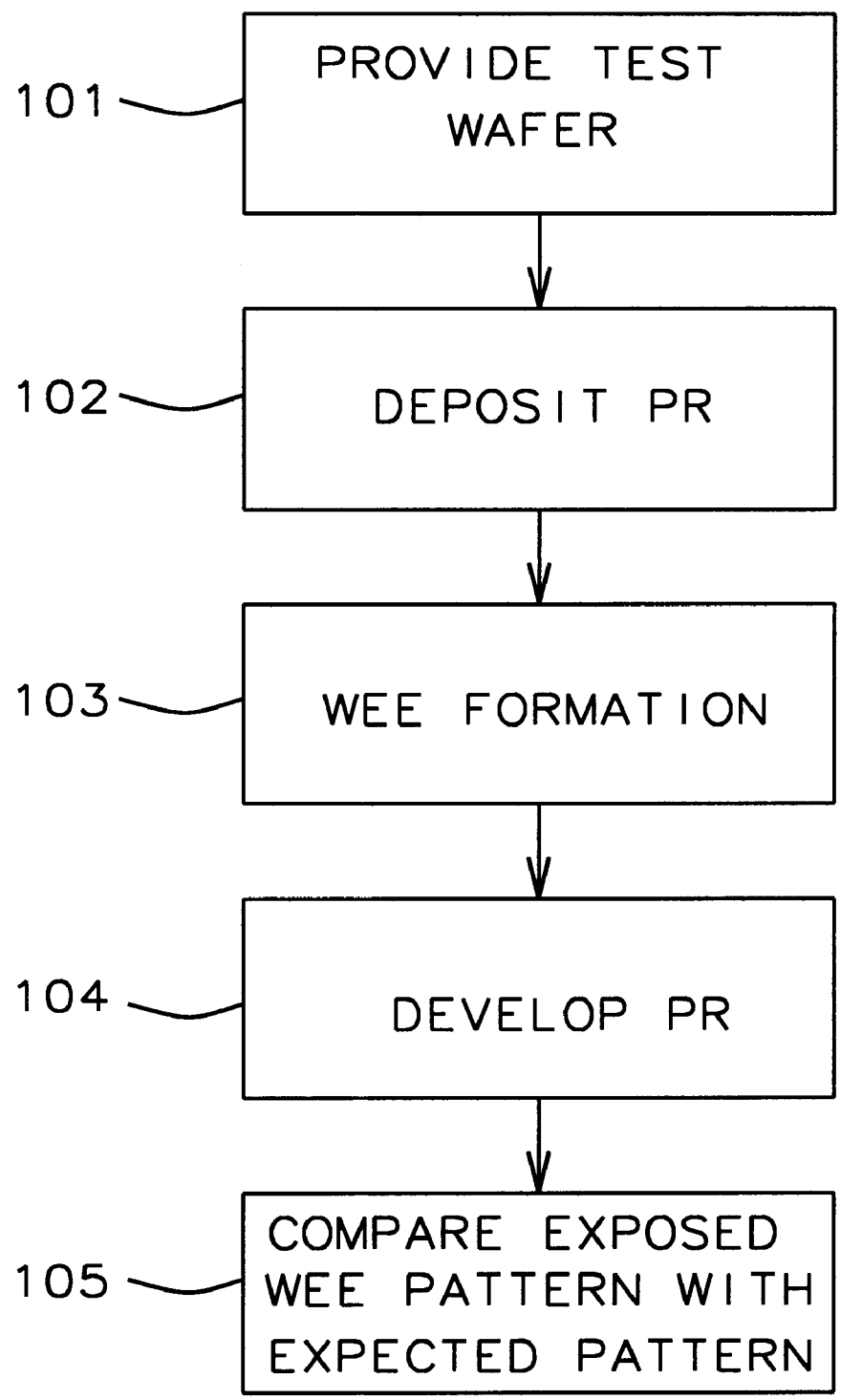
FIG. 9 shows a process flow for forming the WEE area using the present invention.

Referring now specifically to FIG. 5, there is shown a method of measuring the relative wafer position by using four alignment sub-patterns 40 through 43 on the surface of substrate 30.

It must be emphasized for clarity that the totality of the alignment marks provided on the surface of the wafer is referred to as the alignment pattern, this totality is divided into for alignment sub-patterns, that is sub-patterns 40 though 43. Each alignment sub-patterns in turn is divided into four alignment measurement scales (to be discussed under FIG. 6 following).

An alignment pattern is provided on a test or alignment reference wafer (that is used for the creation of the WEE) and on all production wafers. The wafer position (of the production wafer) is measured in order to compare the location of the exposed WEE (on the production wafer) with the expected location of the WEE. The four areas 40 through 43 (FIG. 5) do not show the alignment pattern itself, the areas 40 through 43 mark where the four alignment patterns are located on the surface of substrate 30. The four areas 40 through 43 with their corresponding alignment sub-patterns and measurement scales (not shown in FIG. 5) allow the calibration of the wafer position in both the X/Y direction and in the rotational positioning of the wafer.

A further detailed explanation of the alignment procedure is as follows. The alignment sub-pattern associated with area 40 will be used for this explanation. The location of alignment sub-pattern 40 is represented by the small square highlighted with 40. Superimposed over this alignment sub-pattern 40 are two lines 44 and 48. The small square 40, together with lines 44 and 48, are reference lines within the tool that is used to expose the WEE. The lines 44 and 48 can be moved relative to the small square 40, this movement is measured and indicates the amount of alignment correction that is required in order to assure that the wafer alignment is correct. For the creation of the WEE, the test or reference wafer, on the surface of which is the alignment test or reference pattern of the present invention, is positioned in the WEE exposure tool. The pattern of the exposure tool is aligned using the test wafer alignment pattern as described herein. After this alignment of the exposure tool has been completed, the test wafer is removed and replaced with the production wafer. The production wafer also contains an alignment pattern on the surface of the wafer. The alignment pattern on the production wafer is used to align the production wafer with respect to the exposure tool, the WEE for the production wafer is then exposed. Because the position of the production wafer has been aligned with the position of a test or reference wafer, both positions relative to the tool that exposes the WEE area of the production wafer, the WEE exposure on the production wafer is in the desired position.

FIG. 6 shows a top view of one of the four alignment sub-patterns, that is a detailed view of one of the areas 40, 41, 42 or 43 of FIG. 5. Each of the four alignment sub-patterns consists of four alignment measurement scales, that is measurement scales 50 through 53. Each measurement scale is represented by a plurality of dots that make up the measurement scale. The lines 54 and 55 and square 56 do not form part of the alignment sub-pattern but are used here to illustrate the relative positioning of the measurement scales (each collection of 20 alignment marks or dots) of one of the four alignment sub-pattern. The measurement scales 51 and 53 are used to calibrate wafer alignment in the X-direction, measurement scales 50 and 52 are used to calibrate wafer alignment in the rotational direction.

The unique configuration or geometric structure of the alignment marks within each sub-pattern must be noted. Each measurement scale contains a total of 20 alignment marks, these alignment marks are in geometric design divided into two groups, each group forming an equilateral rectangle. The two groups of alignment marks meet at the extremities of their longest side (the hypotenuse) whereby these longest sides further form one line with each of the two equilateral rectangles being positioned at opposite sides of this line. This point of intersection allows for very accurate, fast and convenient application of the alignment technique of the present invention. This point of intersection will henceforth be referred to the center of the alignment measurement scale.

FIG. 7 shows further detail of a size and relative positioning of four of the alignment marks within each a sub-pattern. Each alignment marker forms a square with sides 60 equal to 0.05 mm. The distance 62 between the alignment marks is 0.05 mm, the distance 64 also equals 0.05 mm.

FIG. 8 shows an example of the wafer alignment procedure. Alignment reference lines 74 and 76 (of the WSEE exposure tool) are positioned as shown, that is so that they intersect the alignment measurement scales 70, 71, 72 and 73 as shown, that is these lines 74 and 76 pass through the previously defined center of the alignment measurement scales. The reference rectangle 75 is now adjusted with reference to the position of lines 74 and 76 to the point where the rectangle 75 no longer intersects with any of the individual dots of each of the alignment measurement scales. This can also be stated by saying that the intersection of lines 74 and 76 will be made to coincide with the intersection of the (not shown) diagonals of the square 75.

For each of the alignment marks that crosses or touches the alignment measurement scale an adjustment or offset of 10 um. must be performed. In the example shown alignment measurement scale 70 shows that 3 alignment marks cross the alignment reference pattern 75. Since alignment measurement scale 70 is used to perform rotational alignment, an adjustment of 30 um. must be made to the rotational setting of the wafer to correct the rotational position of the wafer. Alignment measurement scale 71 shows that the X-position of the wafer must be adjusted by 20 um. Adding 20 um. to the position of the wafer will correct the position of the wafer in the X-direction. Standard procedure requires that the X-direction parameter be corrected first after which the rotational parameter is corrected.

FIG. 9 shows the calibration procedure used for the formation of the positioning of the WEE using the present invention. Step 1 indicates that a test or reference wafer is secured. The calibration pattern of the present invention is provided on the surface of the test wafer. Step 2 indicates the deposition of a layer of PR on the surface of a production wafer. Step 3 indicates the creation of the WEE area. Prior Art technique used a rotating stepper in which the wafer was mounted and whereby the wafer edge was exposed by rotating the wafer while the wafer is exposed to UV light. With the present invention the WEE is formed by aligning the four alignment measurement scales of the test wafer under the source of exposure with the four alignment measurement scales on the production wafer and, after the alignment has been completed, exposing the WEE on production wafer. For the creation of the WEE, the test or reference wafer, on the surface of which is the alignment test or reference pattern of the present invention, is positioned in the WEE exposure tool. The pattern of the exposure tool is aligned using the test wafer alignment scales as described herein. After this alignment of the exposure tool has been completed, the test wafer is removed and replaced with the production wafer. The production wafer also contains an alignment pattern on the surface of the wafer. The alignment pattern on the production wafer is used to align the production wafer with respect to the exposure tool, the WEE for the production wafer is then exposed. Because the position of the production wafer has been aligned with the position of a test or reference wafer, both positions relative to the tool that exposes the WEE area of the production wafer, the WEE exposure on the production wafer is in the desired position.

Step 4 shows the developing of the exposed PR, step 5 shows that the exposed pattern is further measured or validated with the pattern that is expected to be created for the WEE. This latter procedure again uses the test wafer and is identical to the procedure used under step 3 above with the exception of the exposure of the PR.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method of calibrating a WEE exposure tool using alignment marks on a semiconductor wafer to determine the degree of alignment of a WEE exposure region during the manufacturing of integrated circuits on a semiconductor substrate, comprising the steps of:

providing a semiconductor substrate said substrate to serve as a test wafer;

providing an alignment pattern on the surface of said test wafer said alignment pattern to contain four alignment sub-patterns wherein each of said alignment sub-patterns contains four alignment scales wherein each of said alignment scales contains a multiplicity of alignment marks;

creating a WEE region on the surface of said test wafer whereby said WEE region is aligned using said alignment pattern thereby creating an expected WEE pattern;

comparing the location of said expected WEE pattern with the location of the actually created WEE pattern thereby measuring the difference in location along an X and an Y-axis between said expected and said actually created WEE patterns; and readjusting said WEE exposure tool thereby correcting said difference in location along said X and said Y-axis between said expected and said actual WEE pattern thereby eliminating errors in exposure of said WEE pattern that are introduced by said WEE exposure tool.

2. The method of claim 1 wherein each of said alignment marks is a square with a width within the range of between 0.03 um and 0.08 um a height within the range of between 0.03 um and 0.08 um whereby further the distance between adjacent marks in the X-direction is within the range of between 0.03 um and 0.08 um whereby furthermore the distance between adjacent marks in the Y-direction is within the range of between 0.03 um and 0.08 um whereby furthermore the direction of one of the sides of said square is the X-direction.

3. The method of claim 1 wherein each alignment scale contains a total of 20 alignment marks said alignment marks being arranged in a geometric design divided into two groups whereby each of said groups forming a equilateral rectangle whereby said two groups of alignment marks meet but do not overlay at the extremities of the longest line of said equilateral rectangle whereby said longest lines further form one line whereby further each of said two equilateral rectangles are positioned at opposite sides of said line whereby further said point where said equilateral rectangles meet forms the geometric center of said alignment scale.

4. The method of claim 1 wherein said alignment sub-pattern contains a set of four alignment scales whereby the direction of the line connecting said geometric centers of a set of two non-adjacent alignment scales is the X-direction whereby furthermore the direction of the line connecting said geometric centers of the remaining set of two non-adjacent scales is the Y-direction whereby furthermore the longest side of said equilateral rectangles that form said alignment scales intersect the X and Y direction under an angle of 45 degrees whereby furthermore said geometric centers of said scales are located on the sides of an imaginary square said square having sides of a length that is appreciably larger than any of the linear dimensions that pertain to said scale whereby furthermore the intersection of the two lines that connect said geometric centers of non-adjacent alignment scales forms the geometric center of said alignment sub-pattern.

5. The method of claim 1 wherein said alignment pattern is a set of four alignment sub-patterns said alignment sub-patterns being located around the periphery of said surface of said semiconductor wafer said alignment sub-patterns further being located at equal distance from the geometric center of said semiconductor wafer whereby furthermore said geometric centers of said four alignment sub-patterns are positioned with equal angular separation on a circle said circle being concentric with the circle of said semiconductor wafer.

6. The method of claim 1 wherein each of said alignment scale contains a totality of twelve alignment marks.

7. The method of claim 1 wherein each of said alignment scale contains a totality of thirty alignment marks.

8. The method of claim 1 wherein each of said alignment scale contains a totality of forty alignment marks.

9. The method of claim 1 furthermore the steps of:
Providing a wafer alignment measuring tool;
Measuring said semiconductor wafer alignment; and
Correcting said semiconductor wafer alignment.

10. The method of claim 9 wherein said wafer alignment measuring tool contains the means to align alignment reference lines with the lines that interconnect said geometric centers of said alignment scales whereby said wafer measuring tool furthermore contains the means to adjust and measure said alignment reference lines with respect to an alignment reference square said alignment reference square forming a square through said geometric centers of said alignment scales.

11. The method of claim 9 wherein said measuring said semiconductor wafer alignment is aligning said wafer measuring tool alignment reference lines with the lines interconnecting said centers of said alignment sub-pattern furthermore observing and measuring the number of alignment marks that intersect in both the X and Y directions with said alignment tool alignment reference square.

12. The method of claim 9 wherein said correcting said semiconductor wafer alignment is adjusting said wafer alignment such that the point of intersection of the lines connecting said center of said alignment sub-patterns coincides with the point of intersection of the diagonals of said alignment tool alignment reference square.

* * * * *